United States Patent
Tian et al.

(10) Patent No.: US 11,927,652 B1
(45) Date of Patent: Mar. 12, 2024

(54) STRUCTURE, METHOD, AND ELECTRONIC DEVICE FOR MULTI-COIL HANDHELD MAGNETIC PARTICLE IMAGING

(71) Applicant: Beijing University of Aeronautics and Astronautics, Beijing (CN)

(72) Inventors: Jie Tian, Beijing (CN); Haoran Zhang, Beijing (CN); Bo Zhang, Beijing (CN); Yu An, Beijing (CN)

(73) Assignee: Beijing University of Aeronautics and Astronautics, Beijing (CN)

( * ) Notice: Subject to any disclaimer, the term of this patent is extended or adjusted under 35 U.S.C. 154(b) by 0 days.

(21) Appl. No.: 18/384,882

(22) Filed: Oct. 29, 2023

(30) Foreign Application Priority Data

Feb. 6, 2023 (CN) .......................... 202310066315.5

(51) Int. Cl.
*G01R 33/12* (2006.01)
*G01R 33/00* (2006.01)

(52) U.S. Cl.
CPC ..... *G01R 33/1276* (2013.01); *G01R 33/0041* (2013.01); *G01R 33/0047* (2013.01)

(58) Field of Classification Search
CPC ............ G01R 33/0035; G01R 33/0023; G01R 33/0017; G01R 31/3191; G01R 33/0358; G01R 33/0356; G01R 33/3852; G01R 33/1276; G01R 33/383; G01B 7/004; G01C 17/38; G06F 3/017; G06F 3/0346; G06F 3/012; H01L 39/223
See application file for complete search history.

(56) References Cited

U.S. PATENT DOCUMENTS

2017/0067972 A1* 3/2017 Diamond ........... G01R 33/1276

FOREIGN PATENT DOCUMENTS

| CN | 103260507 A | 8/2013 | |
|---|---|---|---|
| CN | 105054932 A | 11/2015 | |
| CN | 110573072 A | 12/2019 | |
| CN | 113288106 A | 8/2021 | |
| CN | 113433495 A | 9/2021 | |
| CN | 115211834 A | 10/2022 | |
| JP | 2017086778 A | 5/2017 | |
| WO | WO-2022019835 A1 * | 1/2022 | ........... A61B 5/0035 |

* cited by examiner

*Primary Examiner* — Jermele M Hollington
*Assistant Examiner* — Taqi R Nasir
(74) *Attorney, Agent, or Firm* — Bayramoglu Law Offices LLC

(57) ABSTRACT

A structure, a method, and an electronic device for multi-coil handheld magnetic particle imaging (MPI) are provided. The structure for multi-coil handheld MPI includes a processing device, a control device, an imager, a gradient and scanning module, an excitation and correction module, and a detection module, where the gradient and scanning module includes a first circular coil pair and a second circular coil pair; the excitation and correction module includes a circular excitation and correction coil; and the detection module includes a circular detection coil. The structure for multi-coil handheld MPI focuses the imaging region in a specific part, improving the MPI accuracy, and features small volume, simple structure, and low power consumption.

12 Claims, 5 Drawing Sheets

STRUCTURE, METHOD, AND ELECTRONIC DEVICE FOR MULTI-COIL HANDHELD MAGNETIC PARTICLE IMAGING

CROSS REFERENCE TO THE RELATED APPLICATIONS

This application is based upon and claims priority to Chinese Patent Application No. 202310066315.5, filed on Feb. 6, 2023, the entire contents of which are incorporated herein by reference.

TECHNICAL FIELD

The present disclosure belongs to the technical field of magnetic particle imaging (MPI), and in particular relates to structure, method, and electronic device for a multi-coil handheld MPI.

BACKGROUND

Magnetic particle imaging (MPI) is a new type of multifunctional tomography that can image the distribution of superparamagnetic iron oxide (SPIO) nanoparticles in the body. Designed based on the nonlinear response characteristic of SPIO nanoparticles in an alternating field, MPI systems are not limited by imaging depth, and have high spatial resolution and high sensitivity. MPI has been proven to be suitable for various medical applications, such as lung perfusion, intestinal bleeding, cardiovascular intervention, trauma detection and others, and is developing towards human applications after rapid development and medical application experiments.

Currently, most devices for MPI adopt closed-bore design. Therefore, to achieve detection and imaging of large-sized animals, the bore size of the device must be increased. However, the increased bore size will lead to a decrease in parameters such as device sensitivity and resolution, as well as an increase in power. In addition, since the target detection region is smaller than the bore region, the increased bore size will result in low space utilization and high power consumption. In view of the above, the present disclosure proposes a structure for multi-coil handheld MPI, which can perform imaging in a designated region and has the advantages of small volume and low power consumption.

SUMMARY

The present disclosure aims to solve the above-mentioned problem in the prior art, that is, the existing devices for magnetic particle imaging (MPI) have large volume, complex structure, and poor imaging accuracy, and are unable to detect a local region. For this purpose, the present disclosure proposes a structure for multi-coil handheld MPI. The structure for multi-coil handheld MPI includes a processing device, a control device, and an imager, and further includes:

a gradient and scanning module, including a first circular coil pair and a second circular coil pair, where axes of two circular coils in each of the first circular coil pair and the second circular coil pair are parallel but not coaxial; the axes of the two circular coils in the first circular coil pair form a plane as a first plane; the axes of the two circular coils in the second circular coil pair form a plane as a second plane; the first plane is perpendicular to the second plane; the two circular coils in the first circular coil pair are arranged in parallel on a third plane and the two circular coils in the second circular coil pair are arranged in parallel on the third plane; and the third plane is perpendicular to the first plane and the second plane;

an excitation and correction module, including a circular excitation and correction coil; and a detection module, including a circular detection coil;

where, the circular excitation and correction coil and the circular detection coil are arranged in parallel at two sides of the plane where the two circular coils in the first circular coil pair are located;

the gradient and scanning module is configured to construct and adjust a gradient field in a space, so as to generate and drive a field free point (FFP) to move and scan outside the detection module;

the excitation and correction module is configured to generate a biased high-frequency alternating field in a first direction, so as to drive the FFP to move and scan in the first direction and to correct, through the biased high-frequency alternating field, an offset of the first direction during a movement process of the FFP outside the detection module; and the first direction is perpendicular to the third plane; and the detection module is configured to detect a nonlinear magnetic induction signal of magnetic nanoparticles in an imaging region during a scanning process.

In some preferred implementations, the structure for multi-coil handheld MPI takes a direction perpendicular to the third plane as a z-direction and a left-right extension direction of the axes of the two circular coils in the first circular coil pair as an x-direction.

In some preferred implementations, a distance between the two circular coils in the first circular coil pair is equal to a distance between the two circular coils in the second circular coil pair.

In some preferred implementations, a diameter of the circular excitation and correction coil and a diameter of the circular detection coil are both smaller than a longest distance of the first circular coil pair.

In some preferred implementations, currents of a same direction are applied to the two circular coils in the first circular coil pair and the two circular coils in the second circular coil pair; and when the currents applied to the two circular coils in the first circular coil pair and the two circular coils in the second circular coil pair have equal magnitude, the constructed gradient field is symmetrical in the z-direction and the FFP is located in the z-direction; relative magnitude of the currents applied to the two circular coils in the first circular coil pair is adjusted to control the gradient field in a detection region, so as to control the FFP to move and scan in the x-direction; and relative magnitude of the currents applied to the two circular coils in the second circular coil pair is adjusted to control the gradient field in the detection region, so as to control the FFP to move and scan in a y-direction.

In some preferred implementations, triangular wave currents of opposite directions are applied to the two circular coils in the first circular coil pair so as to control the FFP to move and scan periodically in the x-direction; and triangular wave currents of opposite directions are applied to the two circular coils in the second circular coil pair so as to control the FFP to move and scan periodically in the y-direction.

In some preferred implementations, a high-frequency sinusoidal current with a direct current bias is applied to the circular excitation and correction coil; a direct current component in the high-frequency sinusoidal current with the direct current bias is configured to correct movement trajectories of the FFP in the x-direction and the y-direction; and a sinusoidal current component in the high-frequency sinusoidal current with the direct current bias is configured to generate the high-frequency alternating field in the z-direction, so as to move the FFP in the z-direction and excite superparamagnetic iron oxide (SPIO) nanoparticles in the FFP to generate the nonlinear magnetic induction signal.

A second aspect of the present disclosure proposes a multi-coil handheld MPI method, based on the structure for multi-coil handheld MPI, and including:

S100: applying the currents to the two circular coils in the first circular coil pair and the two circular coils in the second circular coil pair so as to generate the gradient field and the FFP;

S200: applying the current to the circular excitation and correction coil so as to move the FFP in the z-direction to scan a target object;

S300: moving the FFP in the x-direction and the y-direction through the first circular coil pair and the second circular coil pair to scan the target object; and S400: reconstructing, based on the nonlinear magnetic induction signal of the SPIO nanoparticles detected by the circular detection coil, a spatial distribution of the SPIO nanoparticles through a preset reconstruction method to obtain a magnetic particle image corresponding to the target object.

A third aspect of the present disclosure provides an electronic device, including at least one processor and a memory communicatively connected to the at least one processor, where the memory stores an instruction executable by the processor; and the instruction is executed by the processor to implement the multi-coil handheld MPI method.

A fourth aspect of the present disclosure provides a computer-readable storage medium. The computer-readable storage medium stores a computer instruction; and the computer instruction is executed by a computer to implement the multi-coil handheld MPI method.

The present disclosure has following beneficial effects:

The present disclosure can focus the imaging region in a specific part, improving the MPI accuracy, and features small volume, simple structure, and low power consumption.

The present disclosure constructs the multi-coil handheld MPI device through the gradient and scanning module, the excitation and correction module, the detection module, the processing device, the control device, and the imager. The gradient and scanning module includes a first circular coil pair and a second circular coil pair. The excitation and correction module includes a circular excitation and correction coil. The detection module includes a circular detection coil. The gradient and scanning module is configured to construct and adjust a gradient field in a space, so as to generate and drive an FFP to move and scan outside the detection module. The excitation and correction module is configured to generate a biased high-frequency alternating field in a z-direction, so as to drive the FFP to move and scan in the z-direction and to correct, through the biased high-frequency alternating field, an offset of the z-direction during a movement process of the FFP outside the detection module. The detection module is configured to detect a nonlinear magnetic induction signal of magnetic nanoparticles in an imaging region during a scanning process. The present disclosure achieves three-dimensional MPI through FFP scanning. The present disclosure can focus the imaging region in a specific part, and features small volume, simple structure, and low power consumption.

BRIEF DESCRIPTION OF THE DRAWINGS

Other features, objectives and advantages of the present disclosure will become more apparent upon reading the detailed description of the non-restrictive embodiments made below with reference to the drawings.

Figure 1:
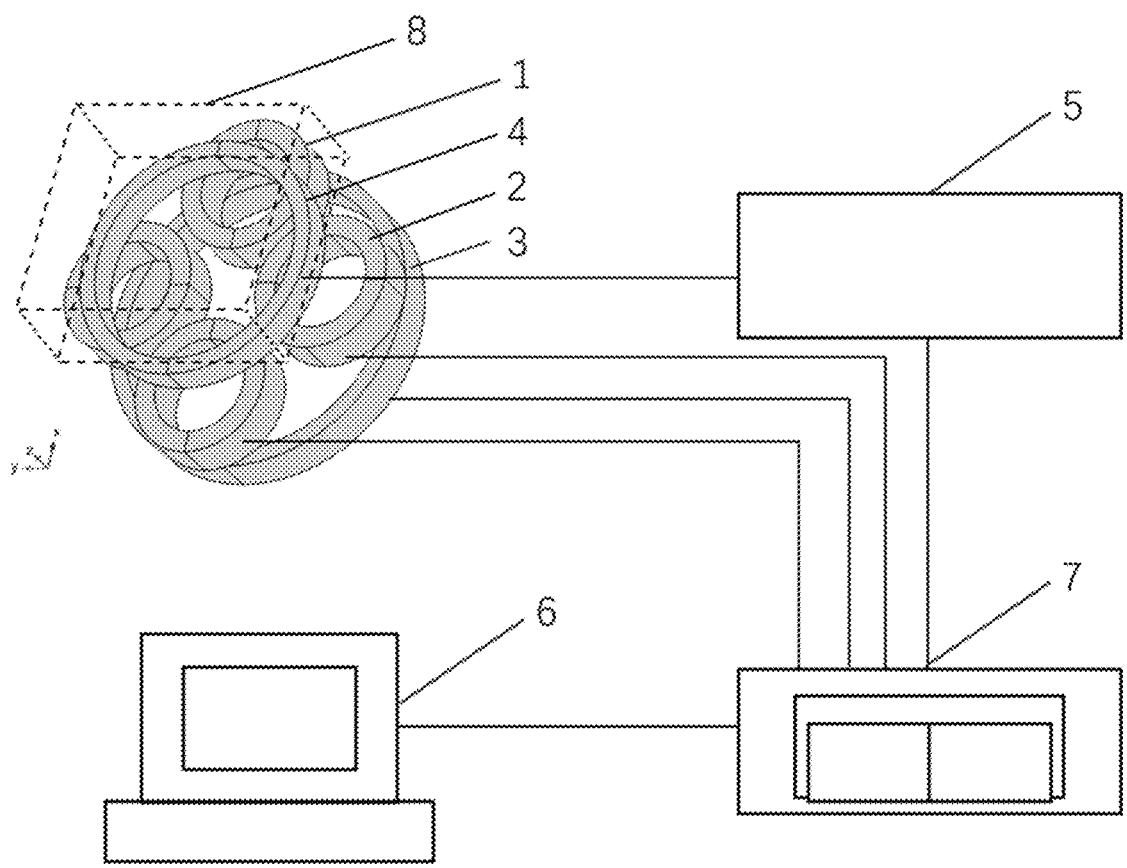
FIG. 1 is a block diagram of a structure for multi-coil handheld magnetic particle imaging (MPI) according to an embodiment of the present disclosure.

Reference Numerals: 1. first circular coil pair; 2. second circular coil pair; 3. circular excitation and correction coil; 4. circular detection coil; 5. processing device; 6. imager; 7. control device; and 8. detection region.

DETAILED DESCRIPTION OF THE EMBODIMENTS

In order to make the objectives, technical solutions, and advantages of the embodiments of the present disclosure clearer, the technical solutions in the embodiments of the present disclosure will be clearly and completely described below in conjunction with the drawings in the embodiments of the present disclosure. Apparently, the described embodiments are some, rather than all of the embodiments of the present disclosure. All other embodiments obtained by those skilled in the art based on the embodiments of the present disclosure without creative efforts shall fall within the protection scope of the present disclosure.

The present disclosure will be further described in detail below in conjunction with the drawings and embodiments. It may be understood that the specific embodiments described herein are merely intended to explain the related invention, rather than to limit the present disclosure. It should be noted that the embodiments in the present disclosure and features in the embodiments may be combined with each other in a non-conflicting situation.

A first embodiment of the present disclosure provides a structure for multi-coil handheld magnetic particle imaging (MPI). As shown in FIG. 1, the structure for multi-coil handheld MPI includes a processing device, a control device, an imager, a gradient and scanning module, an excitation and correction module, and a detection module.

The gradient and scanning module includes a first circular coil pair and a second circular coil pair. Axes of two circular coils in each of the first circular coil pair and the second circular coil pair are parallel but not coaxial. The axes of the two circular coils in the first circular coil pair form a plane as a first plane. The axes of the two circular coils in the second circular coil pair form a plane as a second plane. The first plane is perpendicular to the second plane. The two circular coils in the first circular coil pair are arranged in parallel on a third plane and the two circular coils in the second circular coil pair are arranged in parallel on the third plane. The third plane is perpendicular to the first plane and the second plane.

The excitation and correction module includes a circular excitation and correction coil.

The detection module includes a circular detection coil;

The circular excitation and correction coil and the circular detection coil are arranged in parallel at two sides of the plane where the two circular coils in the first circular coil pair are located.

The gradient and scanning module is configured to construct and adjust a gradient field in a space, so as to generate and drive a field free point (FFP) to move and scan outside the detection module.

The excitation and correction module is configured to generate a biased high-frequency alternating field in a first direction, so as to drive the FFP to move and scan in the first direction and to correct, through the biased high-frequency alternating field, an offset of the first direction during a movement process of the FFP outside the detection module. The first direction is perpendicular to the third plane.

The detection module is configured to detect a nonlinear magnetic induction signal of magnetic nanoparticles in an imaging region during a scanning process.

To more clearly explain the structure for multi-coil handheld MPI in the present disclosure, these modules in the embodiment of the present disclosure are described in detail below with reference to the drawings.

Figure 2:
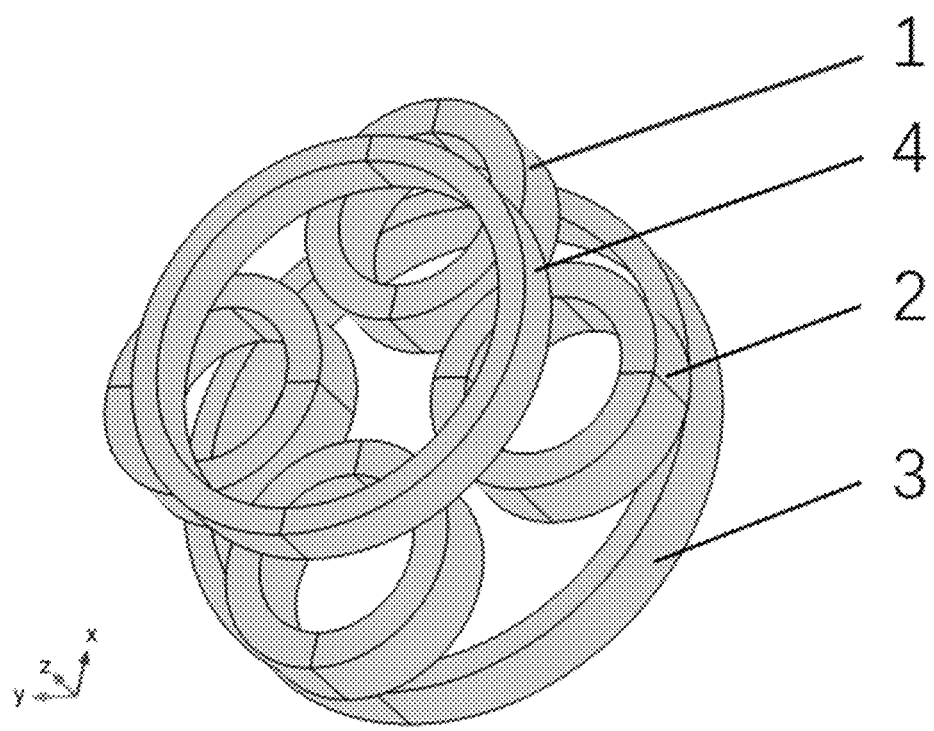
FIG. 2 is a structural diagram of a gradient and scanning module, an excitation and correction module, and a detection module according to an embodiment of the present disclosure.

As shown in FIGS. 1 and 2, the structure for multi-coil handheld MPI includes a processing device, a control device, an imager, a gradient and scanning module, an excitation and correction module, and a detection module.

The gradient and scanning module includes a first circular coil pair and a second circular coil pair. Axes of two circular coils in each of the first circular coil pair and the second circular coil pair are parallel but not coaxial. The axes of the two circular coils in the first circular coil pair form a plane as a first plane. The axes of the two circular coils in the second circular coil pair form a plane as a second plane. The first plane is perpendicular to the second plane. The two circular coils in the first circular coil pair are arranged in parallel on a third plane and the two circular coils in the second circular coil pair are arranged in parallel on the third plane. The third plane is perpendicular to the first plane and the second plane. A distance between the two circular coils in the first circular coil pair is equal to a distance between the two circular coils in the second circular coil pair. In the present disclosure, the first circular coil pair and the second circular coil pair are preferably wound with a copper wire.

In addition, in other embodiments, the first circular coil pair can be replaced by two circular coils and two cylindrical permanent magnets, where the two circular coils are coaxially and respectively located outside the two cylindrical permanent magnets. The second circular coil pair can also be replaced by two circular coils and two cylindrical permanent magnets, where the two circular coils are coaxially and respectively located outside the two cylindrical permanent magnets. The first circular coil pair and the second circular coil pair can be replaced simultaneously.

The excitation and correction module includes a circular excitation and correction coil. In the present disclosure, the excitation and correction module is preferably wound with a high-frequency Litz wire (or multiple strands of Litz wires).

The detection module includes a circular detection coil. In the present disclosure, the detection module is preferably wound with a high-frequency Litz wire. A diameter of the circular excitation and correction coil and a diameter of the circular detection coil are both smaller than a longest distance of the first circular coil pair. The circular excitation and correction coil is larger than the circular detection coil. As shown in FIG. 2, the longest distance of the first circular coil pair refers to a maximum linear distance between points on edges of the two circular coils in the first circular coil pair.

The circular excitation and correction coil and the circular detection coil are arranged in parallel at two sides of the plane where the two circular coils in the first circular coil pair are located, and maintain a certain distance from the plane where the two circular coils in the first circular coil pair are placed to reduce signal coupling. In the present disclosure, preferably, the circular excitation and correction coil is located at a lower side of the first circular coil pair and the second circular coil pair, the circular detection coil is located at an upper side of the first circular coil pair and the second circular coil pair, and the detection region is located at an upper side of the circular detection coil, as shown in FIG. 1.

In the present disclosure, the structure for multi-coil handheld MPI takes a direction perpendicular to the third plane (or referred to as an xy-plane) as a z-direction (or referred to as a z-axis) and a left-right extension direction of the axes of the two circular coils in the first circular coil pair as an x-direction (or referred to as an x-axis). That is, the first circular coil pair and the second circular coil pair are perpendicular to each other, the two circular coils in the first circular coil pair are completely identical and parallel to each other along the x-axis, and the two circular coils in the second circular coil pair are completely identical and parallel to each other along the y-axis.

The gradient and scanning module is configured to construct and adjust a gradient field in a space, so as to generate and drive an FFP to move and scan outside the third plane (i.e., at a side not close to the circular excitation and correction coil) or outside the detection module (i.e., at a side not close to the first circular coil pair or the second circular coil pair (the detection region is marked by the dashed line in FIG. 1)). Specifically:

Currents of a same direction are applied to the two circular coils in the first circular coil pair and the two circular coils in the second circular coil pair.

When the currents applied to the two circular coils in the first circular coil pair and the two circular coils in the second circular coil pair have equal magnitude, the constructed gradient field is symmetrical on the z-axis and the FFP is located on the z-axis. Relative magnitude of the currents applied to the two circular coils in the first circular coil pair is adjusted to control the gradient field in a detection region, so as to control the FFP to move and scan in the x-direction. Relative magnitude of the currents applied to the two circular coils in the second circular coil pair is adjusted to control the gradient field in the detection region, so as to control the FFP to move and scan in a y-direction.

Triangular wave currents of opposite directions are applied to the two circular coils in the first circular coil pair so as to control the FFP to move and scan periodically in the x-direction. Triangular wave currents of opposite directions are applied to the two circular coils in the second circular coil pair so as to control the FFP to move and scan periodically in the y-direction.

The excitation and correction module is configured to generate a biased high-frequency alternating field in a first direction, so as to drive the FFP to move and scan in the first direction and to correct, through the biased high-frequency alternating field, an offset of the first direction during a movement process of the FFP outside the detection module. The first direction is perpendicular to the third plane, namely, a z-direction. Specifically:

A high-frequency sinusoidal current with a direct current bias is applied to the circular excitation and correction coil. A direct current component in the high-frequency sinusoidal current with the direct current bias is configured to correct movement trajectories of the FFP in the x-direction and the y-direction. A sinusoidal current component in the high-frequency sinusoidal current with the direct current bias is configured to generate the high-frequency alternating field in the z-direction, so as to move the FFP in the z-direction and excite SPIO nanoparticles in the FFP to generate the nonlinear magnetic induction signal.

The detection module is configured to detect a nonlinear magnetic induction signal of magnetic nanoparticles in an imaging region during a scanning process.

The processing device is configured to denoise and amplify a signal (i.e., The nonlinear magnetic induction signal) of the circular detection coil.

The imager is configured to reconstruct the signal processed by the processing module into the spatial distribution of the SPIO nanoparticles.

The control device is configured to control the current magnitude in the first circular coil pair, the second circular coil pair, and the circular excitation and correction coil according to a set control instruction, receive the signal of the processing device, and transmit a control result and a detection signal to the imager.

It should be noted that the structure for multi-coil handheld MPI in the above embodiments is only described by taking the division of the above functional modules as an example. In practical applications, the above functions can be completed by different functional modules as required, that is, the modules or steps in the embodiments of the present disclosure are further decomposed or combined. For example, the modules in the above embodiments may be combined into one module, or may be further divided into a plurality of sub-modules to complete all or part of the functions described above. The names of the modules and steps involved in the embodiments of the present disclosure are only for distinguishing each module or step, and should not be regarded as improper limitations on the present disclosure.

Figure 4:
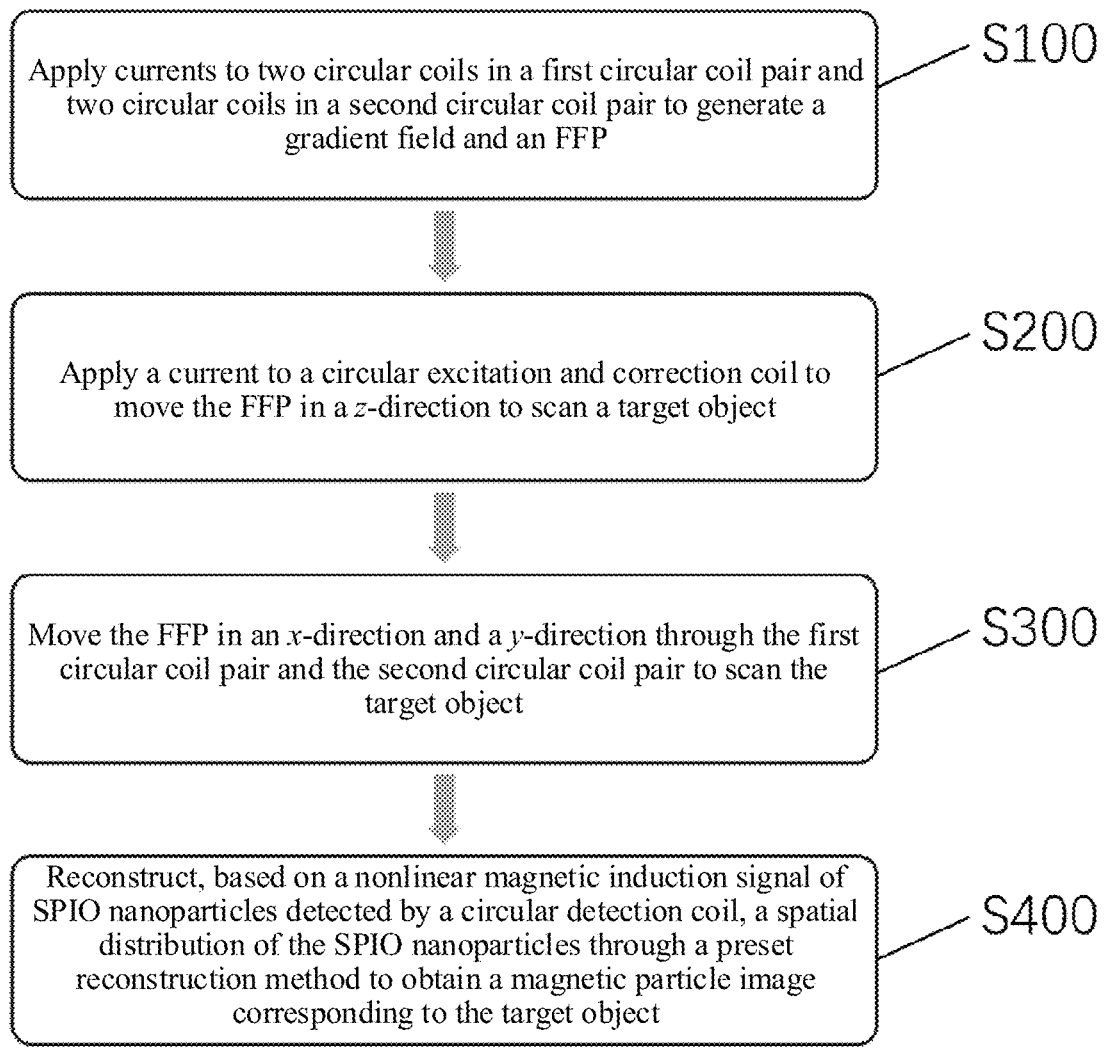
FIG. 4 is a flowchart of a multi-coil handheld MPI method according to an embodiment of the present disclosure.

A second embodiment of the present disclosure proposes a multi-coil handheld MPI method. As shown in FIG. 4, the multi-coil handheld MPI method is implemented through the structure for multi-coil handheld MPI, and includes the following steps.

S100. The currents are applied to the two circular coils in the first circular coil pair and the two circular coils in the second circular coil pair so as to generate the gradient field and the FFP.

In this embodiment, the currents are first applied to the two circular coils in the first circular coil pair and the two circular coils in the second circular coil pair to generate the gradient field and the FFP.

S200. The current is applied to the circular excitation and correction coil so as to move the FFP in the z-direction to scan a target object.

Figure 3:
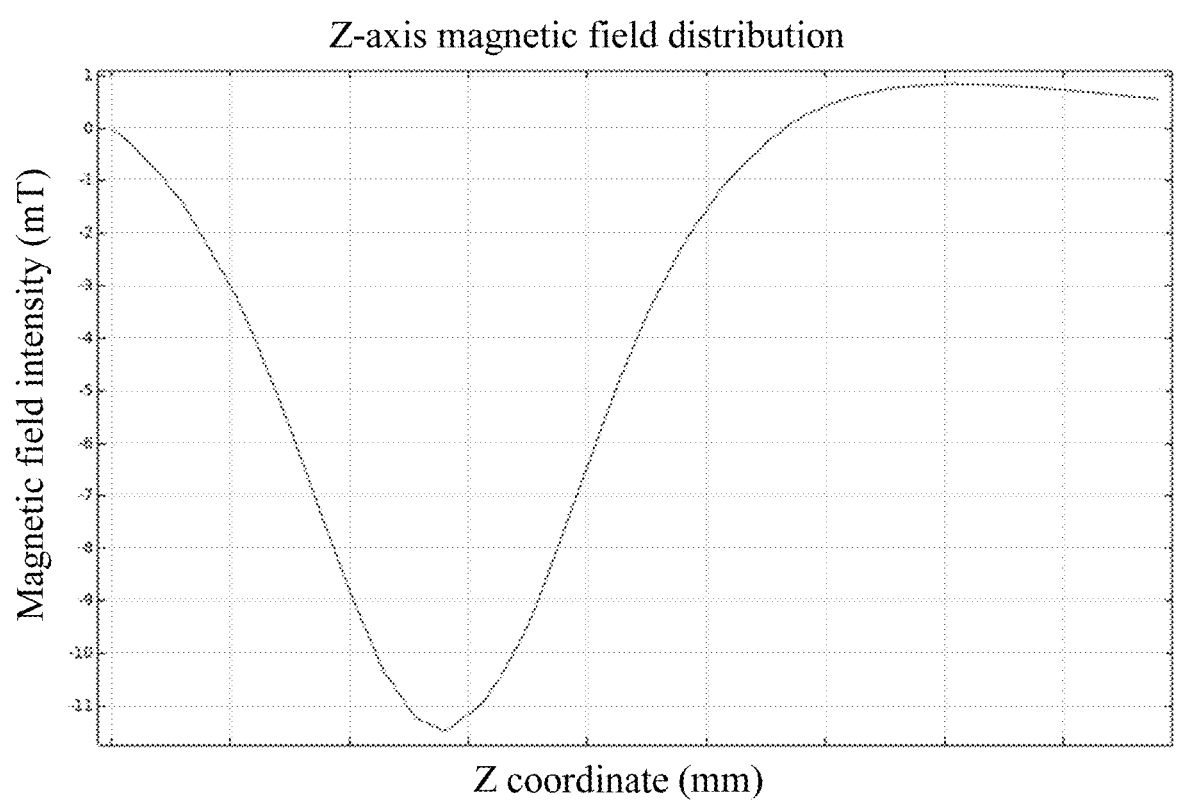
FIG. 3 is a schematic diagram of a simulated magnetic field distribution of the structure for multi-coil handheld MPI on a Z-axis according to an embodiment of the present disclosure.

In this embodiment, the current is applied to the circular excitation and correction coil to move the FFP in the z-direction to scan the target object. A simulated magnetic field distribution of the structure for multi-coil handheld MPI on the z-axis is shown in FIG. 3.

S300. The FFP is moved in the x-direction and the y-direction through the first circular coil pair and the second circular coil pair to scan the target object.

In this embodiment, currents of the same or opposite directions are applied to the first circular coil pair and the second circular coil pair to move the FFP in the x-direction and the y-direction to scan the target object.

S400. Based on the nonlinear magnetic induction signal of the SPIO nanoparticles detected by the circular detection coil, a spatial distribution of the SPIO nanoparticles is reconstructed through a preset reconstruction method to obtain a magnetic particle image corresponding to the target object.

In this embodiment, the nonlinear magnetic induction signal of the SPIO nanoparticles is acquired by the circular detection coil. The nonlinear magnetic induction signal of the SPIO nanoparticles is reconstructed through a preset reconstruction method to generate a magnetic particle image. In the present disclosure, the preset reconstruction method is preferably a "system matrix" reconstruction method. In other embodiments, the preset reconstruction method can be selected based on the actual situation.

Those skilled in the art should clearly understand that, for convenience and brevity of description, reference is made to corresponding processes in the above device embodiments for specific working processes of the method, and details are not described herein again.

A third embodiment of the present disclosure provides an electronic device, including at least one processor and a memory communicatively connected to the at least one processor, where the memory stores an instruction executable by the processor; and the instruction is executed by the processor to implement the multi-coil handheld MPI method.

A fourth embodiment of the present disclosure provides a computer-readable storage medium. The computer-readable storage medium stores a computer instruction; and the computer instruction is executed by a computer to implement the multi-coil handheld MPI method.

Those skilled in the art can clearly understand that, for convenience and brevity of description, reference can be made to a corresponding process in the above method embodiment for specific working processes and related descriptions of the above electronic device and computer-readable storage medium. Details are not described herein again.

Figure 5:
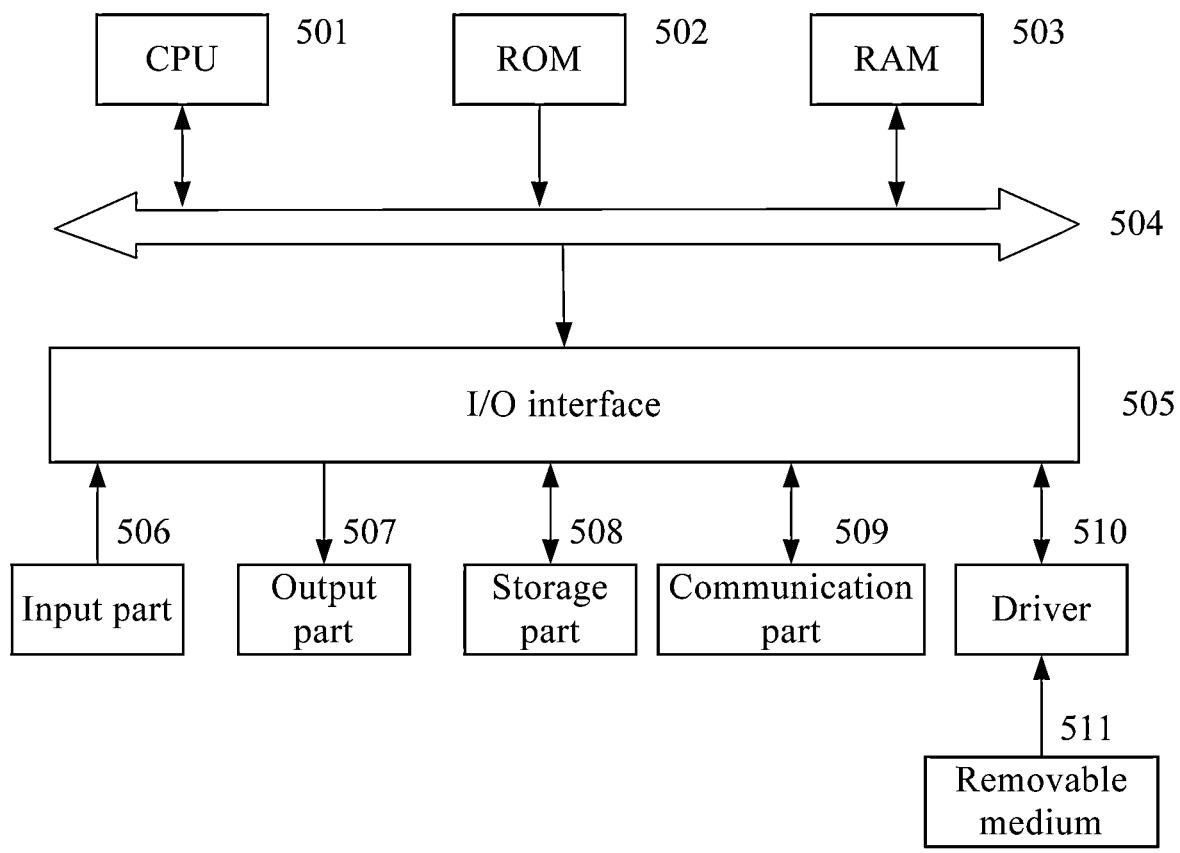
FIG. 5 is a structural diagram of a computer system of an electronic device, suitable for implementing embodiments of the present disclosure, according to an embodiment of the present disclosure.

FIG. 5 is a schematic structural diagram of a computer system of a server suitable for implementing the method and device embodiments of the present disclosure. The server shown in FIG. 5 is merely an example, and should not be conceived as any limitation to the functions and application range of the embodiments of the present disclosure.

As shown in FIG. 5, the computer system includes a central processing unit (CPU) 501, which can perform various suitable actions and processing according to a program stored in a read-only memory (ROM) 502 or a program loaded from a storage part 508 to a random access memory (RAM) 503. The RAM 503 further stores various programs and data required for operations of the system. The CPU 501, the ROM 502, and the RAM 503 are connected to each other through a bus 504. An input/output (I/O) interface 505 is also connected to the bus 504.

The following components are connected to the I/O interface 505: an input part 506 including a keyboard and a mouse; an output part 507 including a cathode-ray tube (CRT), a liquid crystal display (LCD) and a loudspeaker; the storage part 508 including a hard disk; and a communication part 509 including a network interface card such as a local area network (LAN) card or a modem. The communication part 509 executes communication processing via a network such as the Internet. A driver 510 may also be connected to the I/O interface 505 as required. A removable medium 511, such as a magnetic disk, an optical disc, a magneto-optical disc, or a semiconductor memory, is installed on the driver 510 as required, such that a computer program read therefrom can be installed in the storage part 508 as required.

Particularly, according to the embodiments of the present disclosure, the process described above with reference to the flowchart may be implemented as a computer software program. For example, an embodiment of the present disclosure includes a computer program product including a computer program carried by a computer-readable medium. The computer program includes program code for executing the method shown in the flowchart. In this embodiment, the computer program may be downloaded from a network by means of the communication part 509, and/or be downloaded from a removable medium 511. When the computer program is executed by the CPU 501, the functions defined in the method of the present disclosure are executed. It should be noted that, the computer-readable medium in the present disclosure may be a computer-readable signal medium, a computer-readable storage medium, or a combination thereof. The computer-readable storage medium, may be, for example, but not limited to, electrical, magnetic, optical, electromagnetic, infrared, or semiconductor systems, apparatuses, or devices, or any combination thereof. More specific examples of the computer-readable storage medium may include, but are not limited to: an electric connector with one or more wires, a portable computer magnetic disk, a hard disk, a RAM, a ROM, an erasable programmable read-only memory (EPROM or flash memory), an optical fiber, a compact disk read-only memory (CD-ROM), an optical storage device, a magnetic storage device, or any proper combination thereof. In the present disclosure, the computer-readable storage medium may be any tangible medium including or storing a program, and the program may be used by or used in combination with an instruction execution system, apparatus or device. In the present disclosure, the computer-readable signal medium may include a data signal propagated in a baseband or propagated as a part of a carrier, and carries a computer-readable program code. The propagated data signal may be in various forms, including but not limited to an electromagnetic signal, an optical signal, or any suitable combination thereof. The computer-readable signal medium may alternatively be any computer-readable medium except the computer-readable storage medium. The computer-readable medium may send, propagate or transmit a program used by or used in combination with an instruction execution system, apparatus or device. The program code contained on the computer-readable medium may be transmitted using any suitable medium, including but not limited to: wireless, wire, optical fiber, RF, or any suitable combination thereof.

The computer program code for executing the operations in the present disclosure may be compiled by using one or more program design languages or a combination thereof. The programming languages include object oriented programming languages, such as Java, Smalltalk, and C++, and conventional procedural programming languages, such as C or similar programming languages. The program code may be executed fully on a user computer, executed partially on a user computer, executed as an independent software package, executed partially on a user computer and partially on a remote computer, or executed fully on a remote computer or a server. When a remote computer is involved, the remote computer may be connected to the user computer via any type of network including a LAN or a wide area network (WAN), or may be connected to an external computer (for example, connected via the Internet by using an Internet service provider).

The flowcharts and block diagrams in the accompanying drawings illustrate system architectures, functions and operations that may be implemented by the system, method and computer program product according to the embodiments of the present disclosure. In this regard, each block in the flowcharts or block diagrams may represent a module, a program segment or a part of code, and the module, the program segment or the part of code includes one or more executable instructions for implementing specified logic functions. It should also be noted that, in some alternative implementations, the functions marked in the blocks may alternatively occur in a different order from that marked in the drawings. For example, two successively shown blocks actually may be executed in parallel substantially, or may be executed in reverse order sometimes, depending on the functions involved. It should also be noted that each block in the flowcharts and/or block diagrams and combinations of the blocks in the flowcharts and/or block diagrams may be implemented by a dedicated hardware-based system for executing specified functions or operations, or may be implemented by a combination of dedicated hardware and computer instructions.

Terms such as "first" and "second" are intended to distinguish between similar objects, rather than describe or indicate a specific order or sequence.

Terms "include", "comprise" or any other variations thereof are intended to cover non-exclusive inclusions, so that a process, a method, an article, or a device/apparatus including a series of elements not only includes those elements, but also includes other elements that are not explicitly listed, or also includes inherent elements of the process, the method, the article or the device/apparatus.

The technical solutions of the present disclosure are described in the preferred implementations with reference to the drawings. Those skilled in the art should easily understand that the protection scope of the present disclosure is apparently not limited to these specific implementations. Those skilled in the art can make equivalent changes or substitutions to the relevant technical features without departing from the principles of the present disclosure, and the technical solutions after these changes or substitutions should fall within the protection scope of the present disclosure.

What is claimed is:

1. A structure for multi-coil handheld magnetic particle imaging (MPI), comprising a processing device, a control device, and an imager, wherein the structure for multi-coil handheld MPI further comprises:

a gradient and scanning module, comprising a first circular coil pair and a second circular coil pair, wherein axes of two circular coils in each of the first circular coil pair and the second circular coil pair are parallel but not coaxial; the axes of the two circular coils in the first circular coil pair form a plane as a first plane; the axes of the two circular coils in the second circular coil pair form a plane as a second plane; the first plane is perpendicular to the second plane; the two circular coils in the first circular coil pair are arranged in parallel on a third plane and the two circular coils in the second circular coil pair are arranged in parallel on the third plane; and the third plane is perpendicular to the first plane and the second plane;

an excitation and correction module, comprising a circular excitation and correction coil; and a detection module, comprising a circular detection coil;

wherein the circular excitation and correction coil and the circular detection coil are arranged in parallel at two sides of a plane where the two circular coils in the first circular coil pair are located;

the gradient and scanning module is configured to construct and adjust a gradient field in a space, wherein a field free point (FFP) is generated and driven to move and scan outside the detection module;

the excitation and correction module is configured to generate a biased high-frequency alternating field in a first direction, wherein the FFP is driven to move and scan in the first direction and an offset of the first direction during a movement process of the FFP outside the detection module is corrected through the biased high-frequency alternating field; and the first direction is perpendicular to the third plane;

the detection module is configured to detect a nonlinear magnetic induction signal of magnetic nanoparticles in an imaging region during a scanning process;

currents of a same direction are applied to the two circular coils in the first circular coil pair and the two circular coils in the second circular coil pair;

when the currents applied to the two circular coils in the first circular coil pair and the two circular coils in the second circular coil pair have equal magnitude, the constructed gradient field is symmetrical in a z-direction and the FFP is located in the z-direction; relative magnitude of the currents applied to the two circular coils in the first circular coil pair is adjusted to control the gradient field in a detection region, wherein the FFP is controlled to move and scan in an x-direction; and relative magnitude of the currents applied to the two circular coils in the second circular coil pair is adjusted to control the gradient field in the detection region, wherein the FFP is controlled to move and scan in a y-direction; and a high-frequency sinusoidal current with a direct current bias is applied to the circular excitation and correction coil; a direct current component in the high-frequency sinusoidal current with the direct current bias is configured to correct movement trajectories of the FFP in the x-direction and they-direction; and a sinusoidal current component in the high-frequency sinusoidal current with the direct current bias is configured to generate the high-frequency alternating field in the z-direction, wherein the FFP in the z-direction is moved and superparamagnetic iron oxide (SPIO) nanoparticles in the FFP is excited to generate the nonlinear magnetic induction signal.

2. The structure for multi-coil handheld MPI according to claim 1, wherein the structure for multi-coil handheld MPI takes a direction perpendicular to the third plane as the z-direction and a left-right extension direction of the axes of the two circular coils in the first circular coil pair as the x-direction.

3. The structure for multi-coil handheld MPI according to claim 2, wherein a distance between the two circular coils in the first circular coil pair is equal to a distance between the two circular coils in the second circular coil pair.

4. The structure for multi-coil handheld MPI according to claim 2, wherein a diameter of the circular excitation and correction coil and a diameter of the circular detection coil are smaller than a longest distance of the first circular coil pair.

5. The structure for multi-coil handheld MPI according to claim 2, wherein triangular wave currents of opposite directions are applied to the two circular coils in the first circular coil pair to control the FFP to move and scan periodically in the x-direction; and triangular wave currents of opposite directions are applied to the two circular coils in the second circular coil pair to control the FFP to move and scan periodically in the y-direction.

6. A multi-coil handheld MPI method, implemented through the structure for multi-coil handheld MPI according to claim 1, and comprising:

S100: applying the currents to the two circular coils in the first circular coil pair and the two circular coils in the second circular coil pair to generate the gradient field and the FFP;

S200: applying the current to the circular excitation and correction coil to move the FFP in the z-direction to scan a target object;

S300: moving the FFP in the x-direction and they-direction through the first circular coil pair and the second circular coil pair to scan the target object; and S400: reconstructing, based on the nonlinear magnetic induction signal of the SPIO nanoparticles detected by the circular detection coil, a spatial distribution of the SPIO nanoparticles through a preset reconstruction method to obtain a magnetic particle image corresponding to the target object.

7. An electronic device, comprising:

at least one processor and a memory communicatively connected to the at least one processor, wherein the memory stores an instruction executable by the processor; and the instruction is executed by the processor to implement the multi-coil handheld MPI method according to claim 6.

8. A computer-readable storage medium, wherein the computer-readable storage medium stores a computer instruction; and the computer instruction is executed by a computer to implement the multi-coil handheld MPI method according to claim 6.

9. The multi-coil handheld MPI method according to claim 6, wherein the structure for multi-coil handheld MPI takes a direction perpendicular to the third plane as the z-direction and a left-right extension direction of the axes of the two circular coils in the first circular coil pair as the x-direction.

10. The multi-coil handheld MPI method according to claim 9, wherein in the structure for multi-coil handheld MPI, a distance between the two circular coils in the first circular coil pair is equal to a distance between the two circular coils in the second circular coil pair.

11. The multi-coil handheld MPI method according to claim 9, wherein in the structure for multi-coil handheld MPI, a diameter of the circular excitation and correction coil and a diameter of the circular detection coil are smaller than a longest distance of the first circular coil pair.

12. The multi-coil handheld MPI method according to claim 9, wherein in the structure for multi-coil handheld MPI, triangular wave currents of opposite directions are applied to the two circular coils in the first circular coil pair to control the FFP to move and scan periodically in the x-direction; and triangular wave currents of opposite directions are applied to the two circular coils in the second circular coil pair to control the FFP to move and scan periodically in they-direction.

\* \* \* \* \*